(12) United States Patent
Wu

(10) Patent No.: US 12,006,573 B2
(45) Date of Patent: Jun. 11, 2024

(54) FILM LAYER CURING APPARATUS

(71) Applicant: CHANGXIN MEMORY TECHNOLOGIES, INC., Anhui (CN)

(72) Inventor: Tiancheng Wu, Hefei (CN)

(73) Assignee: CHANGXIN MEMORY TECHNOLOGIES, INC., Anhui (CN)

(*) Notice: Subject to any disclaimer, the term of this patent is extended or adjusted under 35 U.S.C. 154(b) by 360 days.

(21) Appl. No.: 17/593,241

(22) PCT Filed: May 8, 2021

(86) PCT No.: PCT/CN2021/092286
§ 371 (c)(1),
(2) Date: Sep. 13, 2021

(87) PCT Pub. No.: WO2021/233140
PCT Pub. Date: Nov. 25, 2021

(65) Prior Publication Data
US 2022/0307140 A1 Sep. 29, 2022

(30) Foreign Application Priority Data
May 21, 2020 (CN) .......................... 202010434325.6

(51) Int. Cl.
C23C 16/56 (2006.01)
B05C 11/10 (2006.01)
(Continued)

(52) U.S. Cl.
CPC .......... C23C 16/56 (2013.01); B05C 11/1005 (2013.01); C23C 16/52 (2013.01); H01L 21/67115 (2013.01)

(58) Field of Classification Search
USPC .................................. 118/641–643, 58, 712
See application file for complete search history.

(56) References Cited

U.S. PATENT DOCUMENTS 8,378,322 B2 2/2013 Dahm
9,899,628 B2 2/2018 Nl
(Continued)

FOREIGN PATENT DOCUMENTS

CN 101512648 A 8/2009
CN 101736316 B 3/2013
(Continued)

OTHER PUBLICATIONS

English Translation CN111167684A (Year: 2020).*
(Continued)

Primary Examiner — Yewebdar T Tadesse
(74) Attorney, Agent, or Firm — Syncoda LLC; Feng Ma

(57) ABSTRACT

A film layer curing apparatus includes: a support platform, configured to carry a substrate having a film layer on the substrate surface; and a light source component located above the support platform, the light source component including a light source array being arranged toward the support platform and covering the light outgoing surface of the entire film layer by projection of the light source array, the light source array including multiple point light sources evenly distributed on the light outgoing surface, light emitted by the light source array being able to uniformly irradiate the entire film layer so as to improve the thickness distribution uniformity of the film layer after curing.

7 Claims, 2 Drawing Sheets

(51) Int. Cl.
 C23C 16/52 (2006.01)
 H01L 21/67 (2006.01)

(56) References Cited

U.S. PATENT DOCUMENTS

| | | | |
|---|---|---|---|
| 10,373,823 | B2 | 8/2019 | Srinivasan et al. |
| 10,901,263 | B2 | 1/2021 | He et al. |
| 2006/0249175 | A1 | 11/2006 | Nowak et al. |
| 2014/0231671 | A1* | 8/2014 | Lu ................... H01L 21/6776 |
| | | | 250/455.11 |
| 2017/0097150 | A1 | 4/2017 | Chen et al. |
| 2017/0218208 | A1 | 8/2017 | Betties et al. |

FOREIGN PATENT DOCUMENTS

| | | | |
|---|---|---|---|
| CN | 103287088 A | 9/2013 | |
| CN | 103706545 A | 4/2014 | |
| CN | 109856866 A | 6/2019 | |
| CN | 111167684 A | 5/2020 | |
| EP | 2390102 B1 | 2/2014 | |
| JP | 2009015923 A | 1/2009 | |

OTHER PUBLICATIONS

CN first office action in Application No. 202010434325.6, dated Mar. 9, 2022.
International Search Report (ISR) in Application No. PCT/CN2021/092286, dated Jul. 27, 2021.

* cited by examiner

FILM LAYER CURING APPARATUS

CROSS-REFERENCE TO RELATED APPLICATIONS

This application is a national stage of International Application No. PCT/CN2021/092286 filed on May 8, 2021, which claims priority to Chinese Patent Application No. 202010434325.6, filed on May 21, 2020. The disclosures of these applications are hereby incorporated by reference in their entirety.

TECHNICAL FIELD

The present application relates to the technical field of semiconductor manufacturing, and in particular to a film layer curing apparatus.

BACKGROUND

With the continuous progress of semiconductor manufacturing processes, especially the minimum line width becomes below 20 nm, the aspect ratio of gap filling is getting higher (for example, the aspect ratio is greater than 20), which makes the traditional chemical vapor deposition (CVD) face increasing challenges in void free gap filling. In order to solve this problem, FCVD (Flow-able CVD) was developed. The film layer formed by FCVD has fluidity similar to liquid. The density of the formed film layer is close to the density of the film layer formed by high-density plasma chemical vapor deposition (HDP CVD). Therefore, void free gap filling from the bottom to the top of the gap can be realized.

The curing apparatus in the traditional FCVD uses a long and narrow light source as the curing light source. In order to ensure that the curing light uniformly irradiates the surface of the substrate, the curing light source needs to be rotated. However, the box, in which the curing light source is mounted, is usually large and heavy. The rotation of the box needs to be driven by a powerful motor and a belt, which undoubtedly increases the process cost and the structural complexity of the curing apparatus. In addition, long-term rotation may cause the power connector and signal wire on the box to get loose, causing the machine to alarm. Moreover, over the time, the long and narrow light source will deteriorate in terms of intensity and uniformity. As a result, on one hand, the uniformity of the film layer after curing is low; and on the other hand, the current machine setup does not include effective monitoring and adjustment mechanism, and the process stability can only be ensured by regularly replacing with new light sources. Undoubtedly, this reduces the machine productivity and increases the machine operating cost.

Therefore, how to improve the uniformity of thickness of the film layer after curing while simplifying the structure of the curing apparatus is a technical problem to be solved urgently.

SUMMARY

The present application provides a film layer curing apparatus, which is configured to solve the problems of complex structure of the film layer curing apparatus and low film layer thickness uniformity after curing.

In order to solve the problems, the present application provides a film layer curing apparatus, comprising:

a support platform, configured to carry a substrate having a film layer on the substrate surface; and a light source component located above the support platform, the light source component comprising a light source array being arranged toward the support platform and covering the light outgoing surface of the entire film layer by projection of the light source array, the light source array comprising multiple point light sources evenly distributed on the light outgoing surface, light emitted by the light source array being able to uniformly irradiate the entire film layer so as to improve the thickness distribution uniformity of the film layer after curing.

Optionally, the light outgoing surface is circular; and
the multiple point light sources in the light source array are arranged in multiple circles in the radial direction of the light outgoing surface.

Optionally, the light source component further comprises reflectors located on a side of the light source array away from the support platform to reflect light emitted by the light source array.

Optionally, there are multiple reflectors and the multiple reflectors are in one-to-one correspondence with the multiple point light sources.

Optionally, the light source component further comprises multiple sensors that are in one-to-one correspondence with the multiple point light sources, and the sensors are configured to detect the intensity of light emitted by the corresponding point light sources.

Optionally, the reflector has an arc-shaped cross section and the reflector is covered above the point light source; and
the sensor is mounted on the surface of the reflector facing the point light source; or, the reflector has an opening in which the sensor is embedded.

Optionally, the light source component further comprises a controller which connects the light source array and the multiple sensors to adjust the intensity of light emitted by the point light sources in the light source array according to the intensity of light detected by the sensor.

Optionally, the film layer curing apparatus further comprises a feedback component connected to the controller, to obtain thickness distribution of the film layer after curing, and to adjust the intensity of light emitted by the point light sources according to the thickness distribution of the film layer.

Optionally, the feedback component calculates an input power adjustment range of the point light sources by the following formula:

$$\text{input power adjustment range} = \text{influence coefficient} \times (\text{actual film layer thickness} - \text{target film layer thickness})$$

wherein the influence coefficient is a constant related to the curing performance of the point light sources; the actual film layer thickness is the thickness of a region of the film layer corresponding to the point light source to be adjusted, which is obtained by the feedback component; and the target film layer thickness is the preset thickness for the film layer after curing.

Optionally, the main peak wavelength of light emitted by the point light sources is 380 nm to 400 nm.

In the film layer curing apparatus according to the present application, since a light source array is disposed on the light outgoing surface and the light source array comprises multiple point light sources evenly distributed on the light outgoing surface, light emitted by the light source array can uniformly irradiate the entire surface of the film layer on the substrate. On one hand, it is unnecessary to perform complex rotation operations on the light source, which simplifies the overall structure and operating cost of the film layer curing apparatus; and on the other hand, the uniformity of intensity of light obtained on the entire surface of the film layer can be improved, so that the thickness distribution uniformity of the film layer after curing is greatly improved, the quality of the film layer is improved, and a basis for the smooth progress of the subsequent processes is provided.

DETAILED DESCRIPTION

The specific implementations of the film layer curing apparatus according to the present application will be described in detail below with reference to the accompanying drawings.

Figure 1:
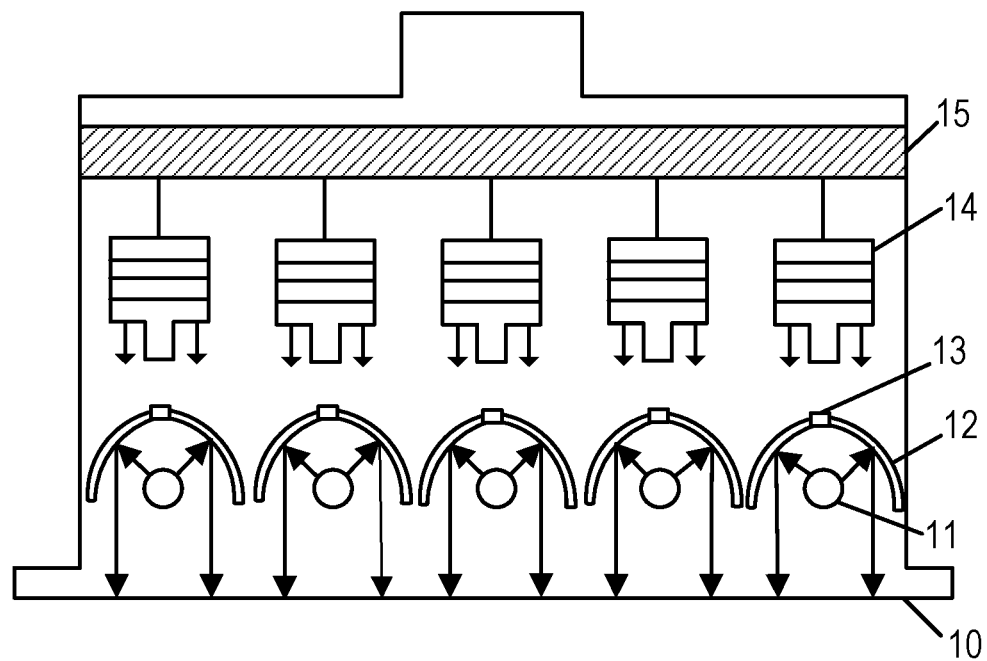
FIG. 1 is an overall schematic structure diagram of a film layer curing apparatus in a specific embodiment of the present application.
Figure 2:
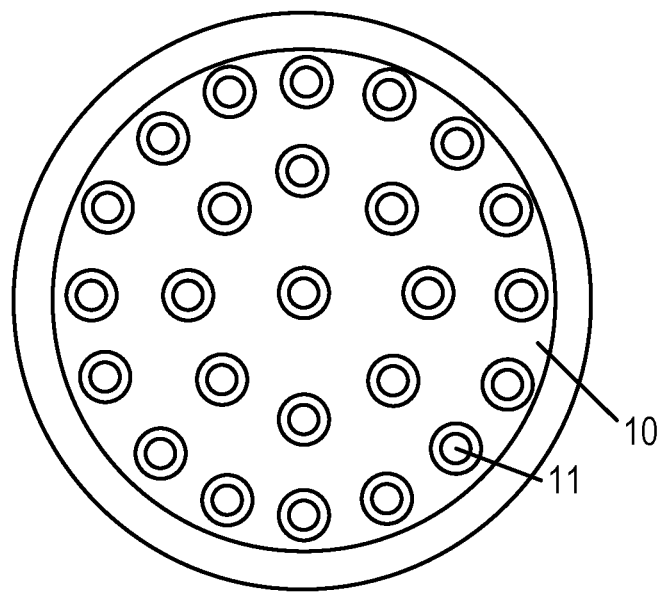
FIG. 2 is a schematic structure diagram of a light source array in a specific implementation of the present application.

This specific implementation provides a film layer curing apparatus. FIG. 1 is an overall schematic structure diagram of a film layer curing apparatus in a specific embodiment of the present application. FIG. 2 is a schematic structure diagram of a light source array in a specific implementation of the present application. As shown in FIG. 1 and FIG. 2, the film layer curing apparatus in this specific implementation comprises:

a support platform, configured to carry a substrate having a film layer on the substrate surface; and a light source component located above the support platform, the light source component comprising a light source array being arranged toward the support platform and covering the light outgoing surface 10 of the entire film layer by projection of the light source array, the light source array comprising multiple point light sources 11 evenly distributed on the light outgoing surface 10, light emitted by the light source array being able to uniformly illuminate the entire film layer so as to improve the thickness distribution uniformity of the film layer after curing.

Specifically, using the multiple point light sources 11 arranged in an array as the curing light source for the film layer can avoid the non-uniform distribution of the thickness of the film layer after curing, which is caused by the non-uniform light intensity distribution in regions of the linear light source. The projection of the light outgoing surface 10 in the vertical direction covers the entire surface of the film layer. All the point light sources 11 in the light source array are uniformly distributed on the light outgoing surface 10. The light source array may be distributed on the entire surface of the light outgoing surface 10, or may be distributed in part of regions on the light outgoing surface 10, as long as light emitted by the light source array can uniformly irradiate the entire surface of the film layer when all the point light sources 11 in the light source array are controlled to emit light. That is, the intensity of light in regions of the film layer is the same. Ensuring the same intensity of light in regions of the film layer can avoid the non-uniform thickness distribution of the film layer after curing, which is caused by the different intensity of light in regions of the film layer. The specific arrangement shape of the light source array may be set according to the shape of the film layer. In order to further improve the uniformity of light irradiated by the light source array, optionally, the light source array is arranged in circles. The specific size of the circular light source array may be set by those skilled in the art according to actual needs. Optionally, the diameter of the circular light source array is 20 cm to 60 cm, for example, 35 cm to 40 cm.

The point light source 11 in this specific implementation may be, but is not limited to, an ultraviolet light source, which may be determined by those skilled in the art according to actual needs, for example, according to the properties of the film layer to be cured. In this specific implementation, all the point light sources 11 in the light source array are the same, that is, all the point light sources have the same length, diameter, material, operating voltage, power, and wavelength of the emitted light. For example, in this specific implementation, all the point light sources 11 are 1 cm to 2 cm in length and 0.8 cm to 1 cm in diameter, are made of quartz mercury lamps, and operate at voltage of 220V to 380V and power of 3.6 KW to 15 KW.

Optionally, the main peak wavelength of light emitted by the point light sources 11 is 380 nm to 400 nm.

Specifically, by limiting the main peak wavelength of light emitted by the point light sources 11 in the light source array within the range of 380 nm to 400 nm, it may be ensured that light emitted by each point light source 11 has only a single peak. Therefore, the uniformity of the intensity of light irradiated to the film layer from the light source array is further improved.

Optionally, the light outgoing surface 10 is circular; and
the multiple point light sources 11 in the light source array are arranged in multiple circles in the radial direction of the light outgoing surface.

For example, as shown in FIG. 2, the light source array is arranged in three circles, and in the radial direction along the light outgoing surface 10, the circles are nested in sequence: there is only one point light source 11 in the innermost circle, there are eight point light sources 11 annularly arranged in the middle circle surrounding the innermost circle, and there are sixteen point light sources 11 annularly arranged in the outermost circle surrounding the middle circle. This is just an example, and the multiple point light sources 11 may be arranged in other ways by those skilled in the art according to actual needs. The multiple circles in this specific implementation refer to two or more circles.

Optionally, the light source component further comprises reflectors 12 located on a side of the light source array away from the support platform to reflect light emitted by the light source array.

Optionally, there are multiple reflectors 12 and the multiple reflectors 12 are in one-to-one correspondence with the multiple point light sources 11.

Figure 3:
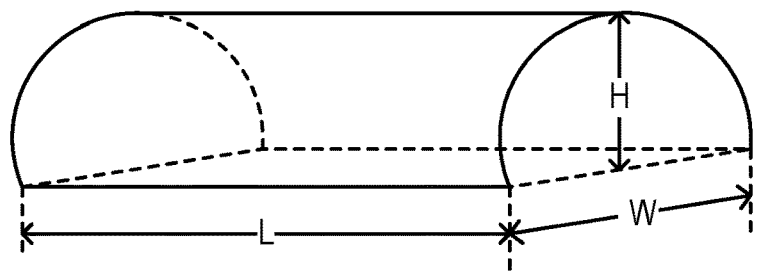
FIG. 3 is a schematic structure diagram of a reflector in a specific implementation of the present application.

FIG. 3 is a schematic structure diagram of a reflector in a specific implementation of the present application. Specifically, as shown in FIGS. 1 and 3, the light source component has multiple reflectors 12 that are in one-to-one correspondence with the multiple point light sources 11. Light emitted by the point light sources 11 is directed to not only the light outgoing surface 10, but also other directions in space. In this specific implementation, by providing a reflector 12 above each point light source 11, light emitted by the point light sources 11 to other directions may be reflected to the light outgoing surface 10, thereby improving the utilization rate of light emitted by the light source array. The material for the reflector 12 may be, but is not limited to, coated optical quartz glass. For example, the reflector 12 may be composed of a combination of two pieces of arc-shaped coated optical quartz glass. The shape of the reflector 12 composed of two pieces of arc-shaped coated optical quartz glass may be an arc-shaped cover structure as shown in FIG. 3. The cover structure is covered above the point light source 11, to reflect light emitted by the point light source 11 to the side surface and/or upper direction to the light outgoing surface 10, so as to irradiate the film layer through the light outgoing surface 10. It is possible for those skilled in the art to use a whole piece of arc-shaped coated optical quartz glass as the reflector 12 according to practical requirements.

The specific size of the reflector 12 may be set by those skilled in the art according to actual needs, for example, according to the size of the point light source 11. In this specific implementation, the reflector 12 of the arc-shaped cover structure has a height H of 0.4 cm to 1 cm, a length L of 2 cm to 4 cm, a width W of 3 cm to 4 cm (when the reflector 12 is composed of a combination of two pieces of arc-shaped coated optical quartz glass, each piece of coated optical quartz glass may have a width of 2 cm to 4 cm, a cross-sectional radius of 6 cm to 12 cm), and a thickness of 1 mm to 1.5 mm.

In this specific implementation, description is made by taking, as an example, the arrangement of the multiple reflectors 12 in one-to-one correspondence with the multiple point light sources 11. It is possible for those skilled in the art to provide only one reflector in the light source component according to actual needs. The reflector covers all the point light sources in the light source array to further simplify the structure of the film layer curing apparatus.

Optionally, the light source component further comprises multiple sensors 13 that are in one-to-one correspondence with the multiple point light sources 11, and the sensors 13 are configured to detect the intensity of light emitted by the corresponding point light sources 11.

Specifically, by providing, for each point light source 11, a sensor 13 to detect the intensity of the emitted light, the light emitting state of the point light source 11 may be monitored in real time, which is convenient to adjust the input power of the point light source 11 according to actual needs. This can improve the uniformity of the thickness distribution of the film layer after curing while improving the flexibility of the film layer curing apparatus when in use.

In this specific implementation, the specific model of the sensor 13 may be determined by those skilled in the art according to actual needs, as long as the intensity of light emitted by the point light source 11 can be detected. For example, the sensor 13 may be GY-39; the chip used by the sensor 13 may be a combination of MAX440039, BME280, and MCU; the power supply may be 3V to 5V; the cross-sectional size of the sensor 13 may be 24.3 mm×26.7 mm; and the communication of the sensor 13 with the outside world may be via an MCU_IIC/MCU_serial port/sensor chip IIC bus. The use of the sensor 13 of this model can detect the intensity of light emitted by the point light source 11 in a wide temperature range; and the light intensity range that may be detected is wide, and the response is fast.

Optionally, the reflector 12 has an arc-shaped cross section and the reflector 12 is covered above the point light source 11; and the sensor 13 is mounted on the surface of the reflector 12 facing the point light source 11; or, the reflector 12 has an opening in which the sensor 13 is embedded.

Specifically, in order not to prevent light emitted by the point light source 11 from being directed from the light outgoing surface 10 to the film layer, the sensor 13 may be located on the top of the reflector 12 in the arc-shaped cover structure, for example, fixed on the inner surface of the reflector 12 facing the point light source 11 or embedded in the opening of the reflector 12. When the reflector 12 is composed of two pieces of coated optical quartz glass, the opening is a gap between the two pieces of coated optical quartz glass. When the reflector is composed of a whole piece of coated optical quartz glass, the opening is located on the top of the coated optical quartz glass.

Optionally, the light source component further comprises a controller 15 which connects the light source array and the multiple sensors 13 to adjust the intensity of light emitted by the point light sources 11 in the light source array according to the intensity of light detected by the sensor 13.

Optionally, the film layer curing apparatus further comprises a feedback component connected to the controller 15, to obtain thickness distribution of the film layer after curing, and to adjust the intensity of light emitted by the point light sources 11 according to the thickness distribution of the film layer.

Optionally, the feedback component calculates an input power adjustment range of the point light sources 11 by the following formula:

input power adjustment range=influence coefficient×(actual film layer thickness−target film layer thickness)

wherein the influence coefficient is a constant related to the curing performance of the point light sources 11; the actual film layer thickness is the thickness of a region of the film layer corresponding to the point light source 11 to be adjusted, which is obtained by the feedback component; and the target film layer thickness is the preset thickness for the film layer after curing.

Figure 4:
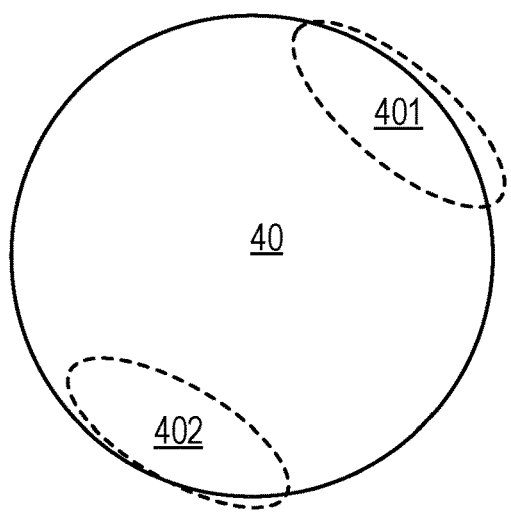
FIG. 4 is a thickness distribution diagram of a film layer obtained after curing in a specific implementation of the present application.
Figure 5:
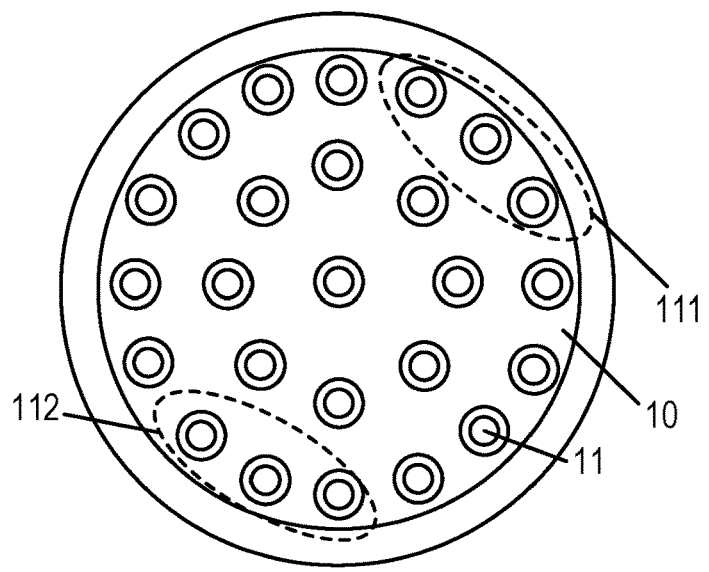
FIG. 5 is a schematic view of adjusting the input power of the point light sources in the light source array according to the thickness distribution of the film layer in a specific implementation of the present application.

FIG. 4 is a thickness distribution diagram of a film layer obtained after curing in a specific implementation of the present application. FIG. 5 is a schematic view of adjusting the input power of the point light sources in the light source array according to the thickness distribution of the film layer in a specific implementation of the present application. Specifically, the feedback component may detect the thickness distribution of the film layer 40 after curing, and adjust the intensity of light emitted by the point light sources 11 in the next curing process by the controller 15 according to the current thickness distribution of the film layer 40. For example, the light source array may be divided into multiple irradiation regions, each having one or more than two point light sources 11. The controller 15 may control all the point light sources 11 in one irradiation region to change the intensity of the emitted light. The film layer 40 may also be divided into multiple film layer thickness regions that are in one-to-one correspondence with the multiple irradiation regions. After the curing process is completed, when the feedback component detects that the thickness of the first film layer thickness region 401 in the film layer 40 is higher than the current average thickness of the film layer 40, the input power adjustment range of the first irradiation region 111 corresponding to the first film layer thickness region 401 is calculated according to the above formula. For example, the input power adjustment range is −10%. In this case, in the next curing process, by the controller 15, the input power transmitted to all the point light sources 11 in the first irradiation region 111 is reduced by 10%. When the feedback component detects that the thickness of the second film layer thickness region 401 in the film layer 40 is lower than the current average thickness of the film layer 40, the input power adjustment range of the second irradiation region 112 corresponding to the second film layer thickness region 402 is calculated according to the above formula. For example, the input power adjustment range is 10%. In this case, in the next curing process, by the controller 15, the input power transmitted to all the point light sources 11 in the first irradiation region 112 is increased by 10%. There is a magnetron 14 between the controller 15 and the point light sources 11 to drive the point light source 11 to emit ultraviolet light.

This specific implementation has been described by taking, as an example, the detection of the thickness distribution of the film layer after curing to adjust the input power of the point light sources in the next curing process. It is possible for those skilled in the art to detect the film layer thickness distribution of the cured part in real time during the curing process according to actual needs, so as to adjust the input power of the point light sources in real time, thus to adjust the intensity of light in different regions of the film layer surface in real time.

The influence coefficient is a constant related to the curing performance of the point light sources 11. The specific value may be preset by those skilled in the art according to actual needs, or may be determined by gathering relevant parameters in the process of curing the film layer by the point light sources 11. For example, the influence coefficient is determined according to the relationship among the input power of the point light sources 11, the intensity of light emitted by the point light sources 11, and the thickness of the film layer cured by the point light sources 11.

In the film layer curing apparatus according to this specific implementation, since a light source array is disposed on the light outgoing surface and the light source array comprises multiple point light sources evenly distributed on the light outgoing surface, light emitted by the light source array can uniformly irradiate the entire surface of the film layer on the substrate. On one hand, it is unnecessary to perform complex rotation operations on the light source, which simplifies the overall structure and operating cost of the film layer curing apparatus; and on the other hand, the uniformity of intensity of light obtained on the entire surface of the film layer can be improved, so that the thickness distribution uniformity of the film layer after curing is greatly improved, the quality of the film layer is improved, and a basis for the smooth progress of the subsequent processes is provided.

The foregoing descriptions are merely preferred implementations of the present application. It should be noted that, for a person of ordinary skill in the art, various improvements and modifications may be made without departing from the principle of the present application, and these improvements and modifications shall be deemed as falling into the protection scope of the present application.

What is claimed is:

1. A film layer curing apparatus, comprising:
    a support platform, configured to carry a substrate having a film layer on a substrate surface; and
    a light source component, located above the support platform, the light source component comprising a light source array being arranged toward the support platform and covering a light outgoing surface of the entire film layer by projection of the light source array, the light source array comprising multiple point light sources evenly distributed on the light outgoing surface, light emitted by the light source array being able to uniformly irradiate the entire film layer so as to improve a thickness distribution uniformity of the film layer after curing, the light source component further comprising multiple reflectors located on a side of the light source array away from the support platform to reflect light emitted by the light source array, and the multiple reflectors being in one-to-one correspondence with the multiple point light sources, the light source component further comprising multiple sensors that are in one-to-one correspondence with the multiple point light sources, and each of the multiple sensors being configured to detect an intensity of light emitted by a corresponding one of the multiple point light sources.

2. The film layer curing apparatus of claim 1, wherein the light outgoing surface is circular; and
    the multiple point light sources in the light source array are arranged in multiple circles in the radial direction of the light outgoing surface.

3. The film layer curing apparatus of claim 1, wherein each of the multiple reflectors has an arc-shaped cross section, and each of the multiple reflectors covers above a corresponding one of the multiple point light sources; and
    each of the multiple sensors is mounted on a surface of a corresponding one of the multiple reflectors facing a corresponding one of the point light sources; or, each of the multiple reflectors has an opening in which a corresponding one of the multiple sensors is embedded.

4. The film layer curing apparatus of claim 3, wherein the light source component further comprises a controller which connects the light source array and the multiple sensors, to adjust the intensity of light emitted by each of the point light sources in the light source array according to intensities of light detected by the multiple sensors.

5. The film layer curing apparatus of claim 4, further comprising a feedback component connected to the controller, configured to obtain a thickness distribution of the film layer after curing, and to adjust the intensity of light emitted by each of the point light sources according to the thickness distribution of the film layer.

6. The film layer curing apparatus of claim 5, wherein the feedback component calculates an input power adjustment intensity of the point light sources by a following formula:

input power adjustment intensity=influence coefficient×(actual film layer thickness−target film layer thickness);

wherein the influence coefficient is a constant related to a curing performance of the point light sources; the actual film layer thickness is a thickness of a region of the film layer corresponding to the point light source to be adjusted, which is obtained by the feedback component; and the target film layer thickness is a preset thickness for the film layer after curing.

7. The film layer curing apparatus of claim 1, wherein a main peak wavelength of light emitted by the point light sources is 380 nm to 400 nm.

* * * * *